United States Patent
Fujimori et al.

(10) Patent No.: US 6,727,513 B2
(45) Date of Patent: Apr. 27, 2004

(54) METHOD OF MANUFACTURING ORGANIC EL ELEMENT

(75) Inventors: Natsuo Fujimori, Suwa (JP); Masaya Ishida, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/465,856

(22) Filed: Jun. 20, 2003

(65) Prior Publication Data

US 2003/0211643 A1 Nov. 13, 2003

Related U.S. Application Data

(62) Division of application No. 09/820,759, filed on Mar. 30, 2001, now Pat. No. 6,610,552.

(30) Foreign Application Priority Data

Mar. 31, 2000 (JP) ........................... 2000-098159
Dec. 6, 2000 (JP) ........................... 2000-371723

(51) Int. Cl.$^7$ ............................................. H01L 29/06
(52) U.S. Cl. ........................................................ 257/12
(58) Field of Search ............................. 438/22; 257/12

(56) References Cited

U.S. PATENT DOCUMENTS

| | | | |
|---|---|---|---|
| 6,129,986 A | | 10/2000 | Bessho et al. |
| 6,364,450 B1 | * | 4/2002 | Yamaguchi et al. .......... 347/33 |
| 6,617,186 B2 | * | 9/2003 | Kashiwabara ................ 438/29 |
| 6,623,097 B2 | * | 9/2003 | Okada et al. ................. 347/21 |
| 2001/0039124 A1 | | 11/2001 | Shimoda |

FOREIGN PATENT DOCUMENTS

| | | |
|---|---|---|
| EP | 0 989 778 A1 | 3/2000 |
| JP | A 9-203803 | 8/1997 |
| JP | A-11-40358 | 2/1999 |
| JP | A-11-54270 | 2/1999 |
| JP | A-11-339957 | 12/1999 |
| WO | WO 99/48229 | 9/1999 |
| WO | WO 01/47045 A1 | 6/2001 |

OTHER PUBLICATIONS

Takai et al., "Coating of trasparent water–repellent thin films by plasma–enhanced CVD", Journal of Non–Crystalline Solids, Elsevier Science B.V., 218, pp. 280–285, 1997.

Tang, C.W. et al., "Organic electroluminescent diodes", *Appl. Phys. Lett.* 51(12), Sep. 21, 1987, pp. 913–915.

Carter, J.C. et al., "Operating stability of light–emitting polymer diodes based on poly(p–phenylene vinylene)", *Appl. Phys. Lett.* 71(1), Jul. 7, 1997, pp. 34–36.

Ulman, Abraham, "Self–Assembled Monolayers", Part Three of *An Introduction to Ultrathin Organic Films From Langmuir–Blodgett to Self–Assembly*, Academic Press Inc., Boston, 1991, pp. 237–304.

\* cited by examiner

*Primary Examiner*—David Nelms
*Assistant Examiner*—Thao P. Le
(74) *Attorney, Agent, or Firm*—Oliff & Berridge, PLC

(57) ABSTRACT

The invention ensures that a liquid is placed in a predetermined region (without being placed in an adjacent region) with a uniform thickness in the region, when a light emitting layer constituting an organic EL element is placed by, for example, ink jet process. Thin $SiO_2$ film pattern having an opening is formed on an ITO electrode. Next, ultrathin organic film pattern having an opening is formed on a thin $SiO_2$ film pattern. The surface of the ultrathin organic film pattern becomes repellent to liquid. Hole transporting layer is formed in the opening of the ultrathin organic film pattern, and then liquid containing a material for the formation of light emitting layer is discharged thereon by ink jet process. Fluid does not remain on the surface of the ultrathin organic film pattern and instead enters the opening of the ultrathin organic film pattern.

10 Claims, 11 Drawing Sheets

[FIG. 1]
(a)            (b)
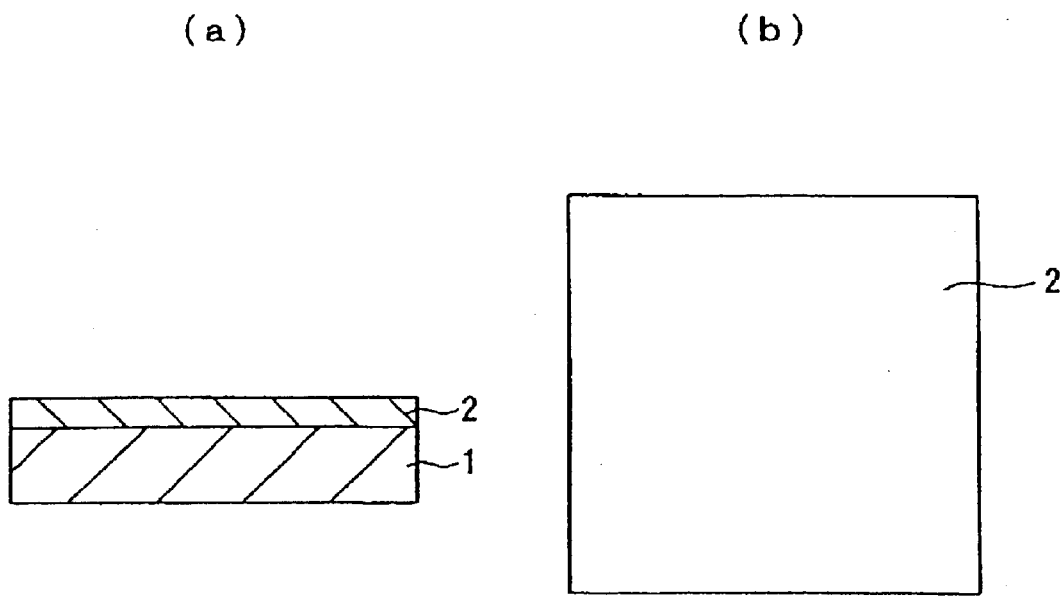
[FIG. 2]
(a)            (b)
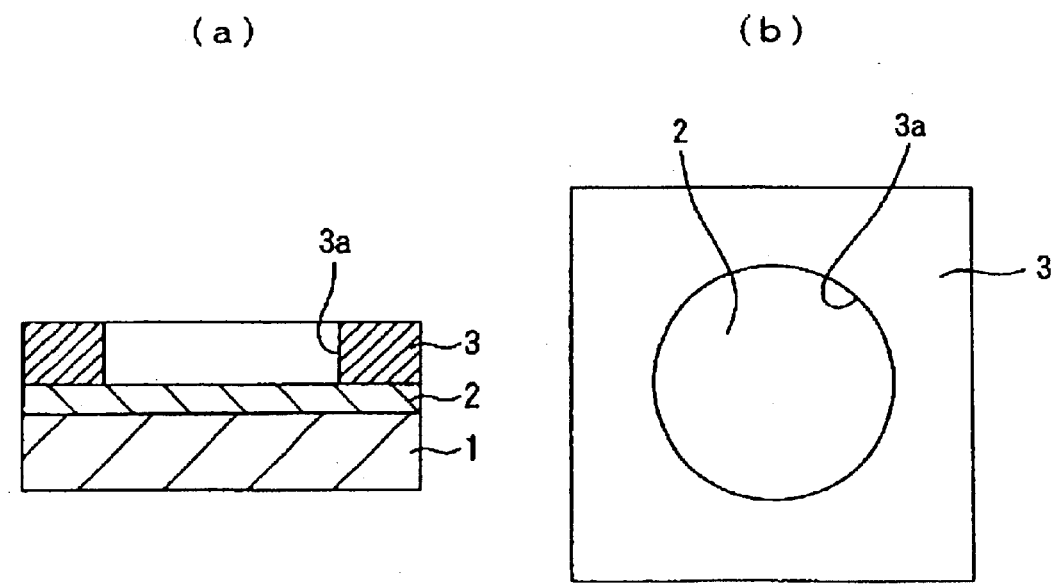

[FIG. 3]
(a) 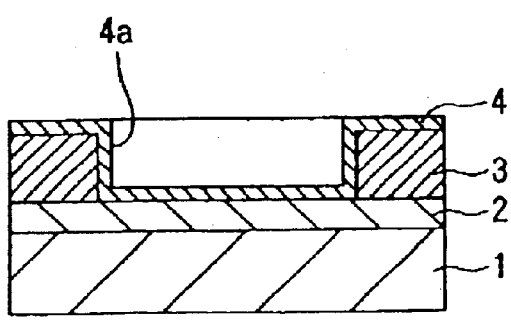
(b) 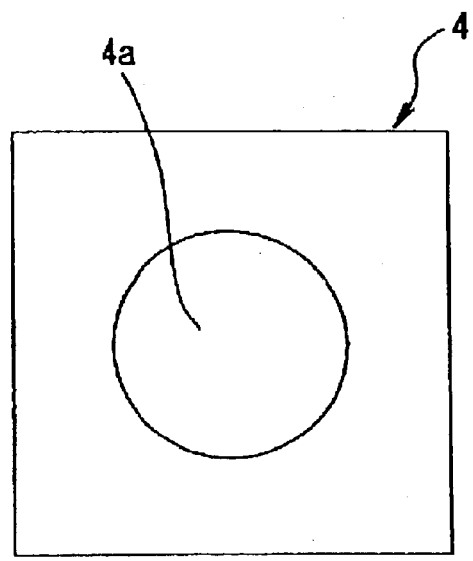
[FIG. 4]
(a) 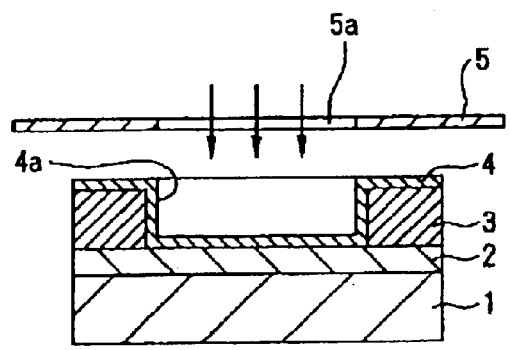
(b) 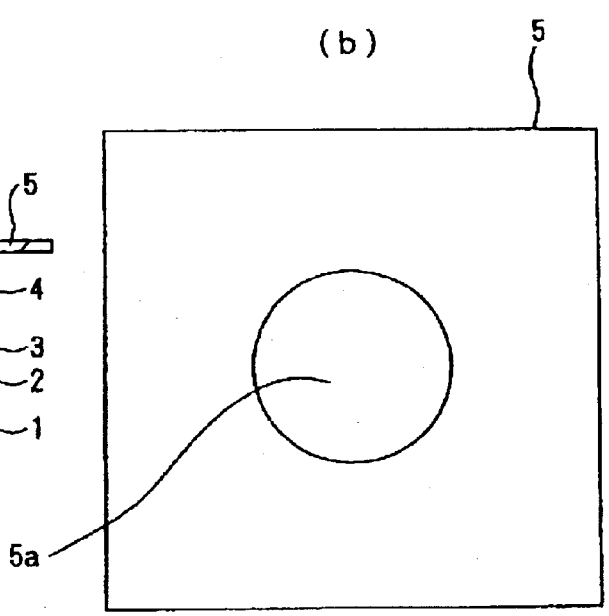

[FIG. 5]
(a)
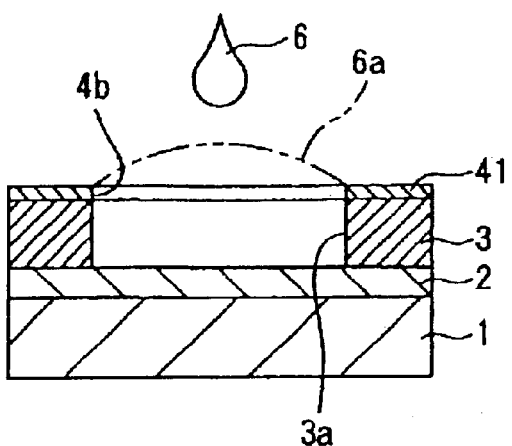
(b)
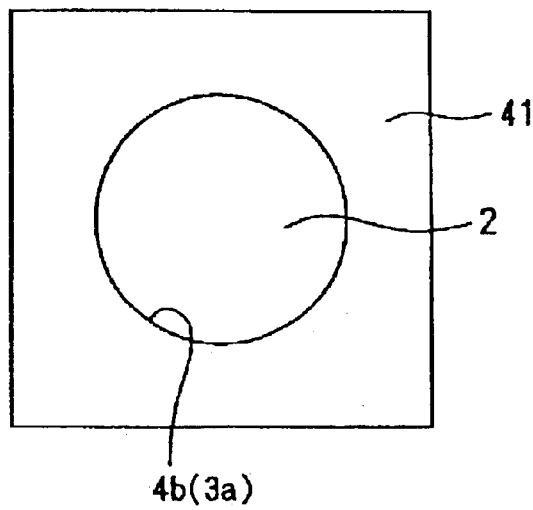
[FIG. 6]
(a)
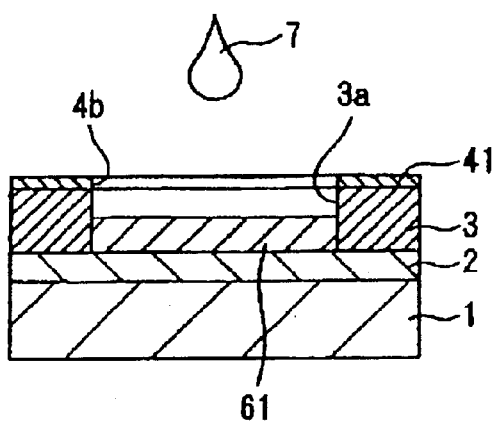
(b)
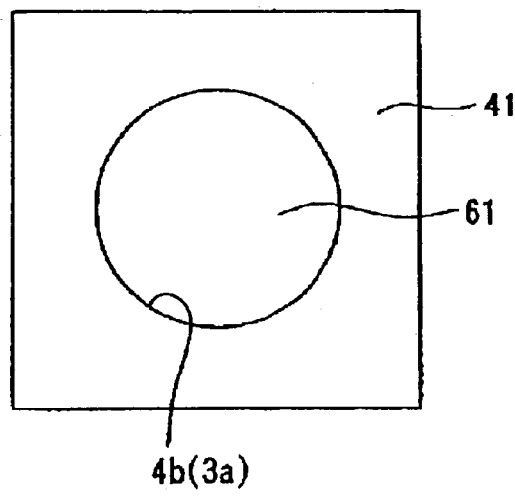

[FIG. 7]
(a) 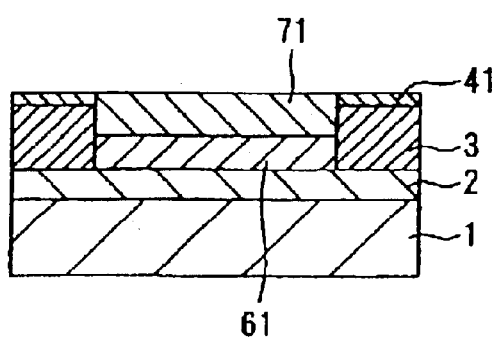
(b) 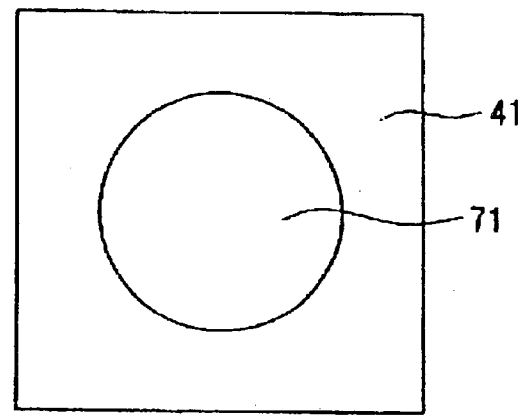
[FIG. 8]
(a) 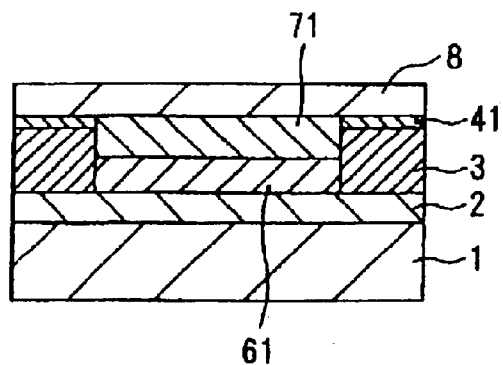
(b) 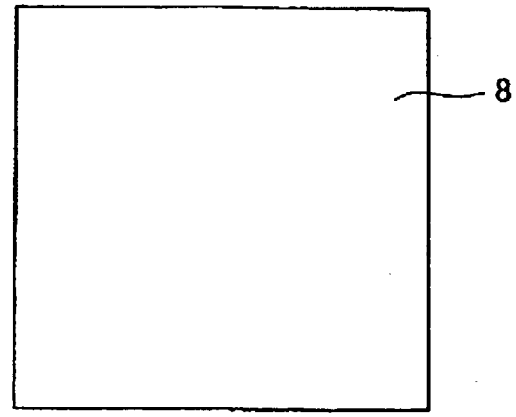

[FIG. 9]
(a)
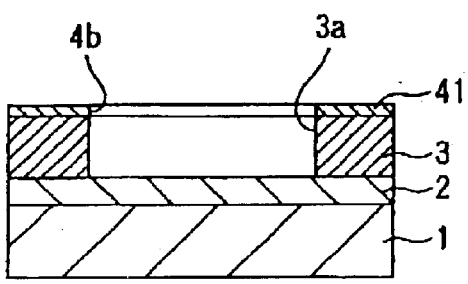
(b)
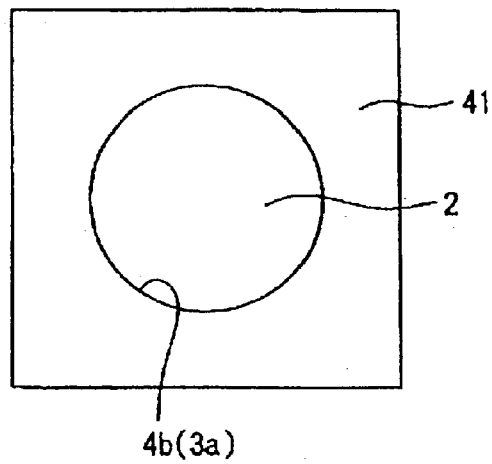
[FIG. 10]
(a)
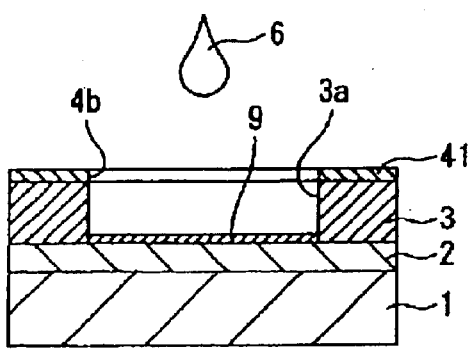
(b)
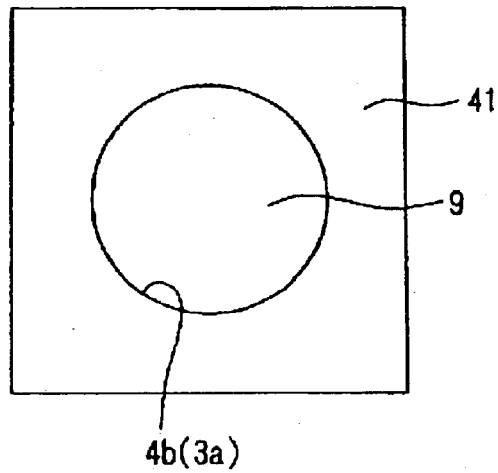

[FIG. 11]
(a)
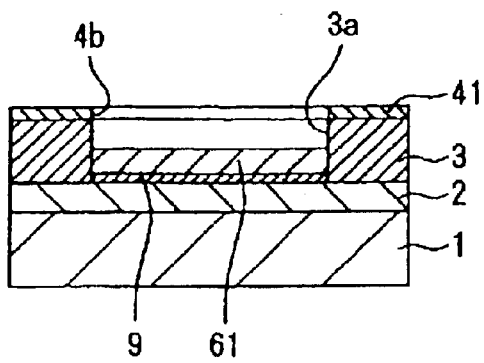
(b)
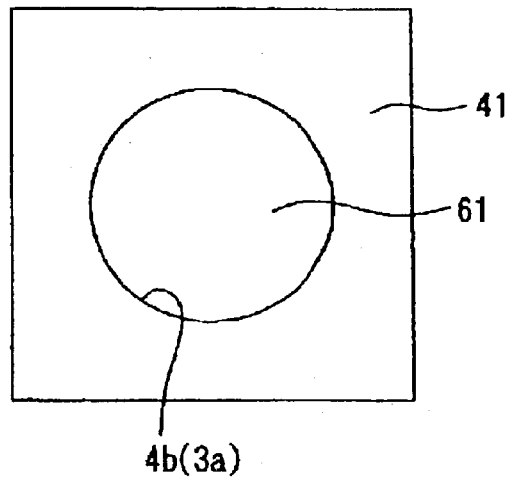
[FIG. 12]
(a)
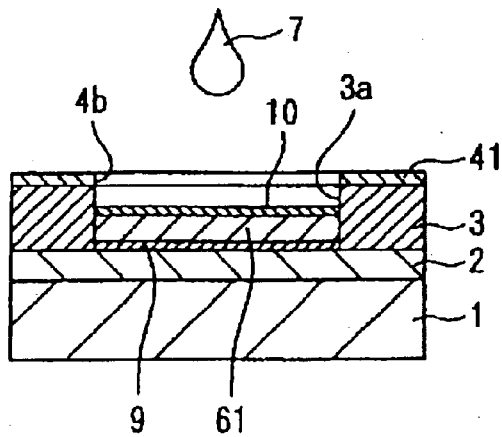
(b)
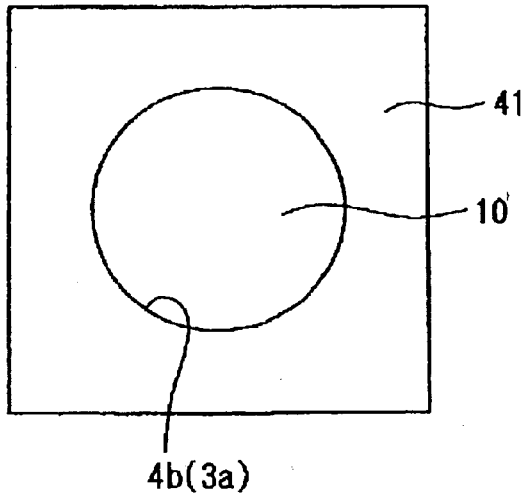

[FIG. 13]
(a) 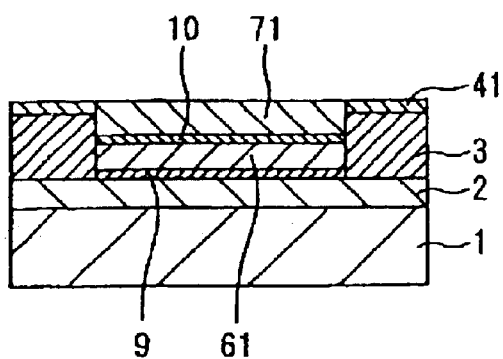
(b) 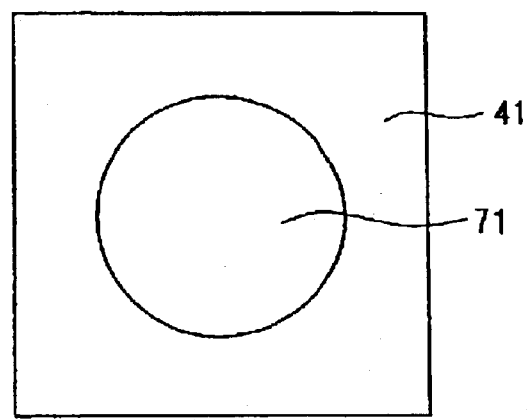
[FIG. 14]
(a) 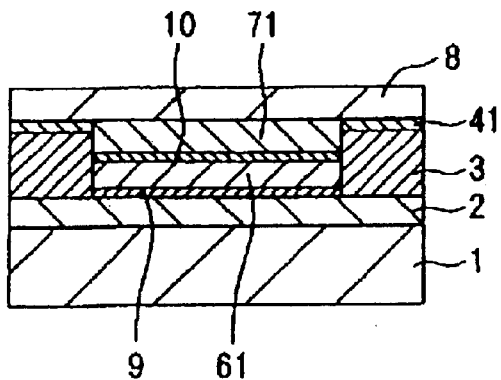
(b) 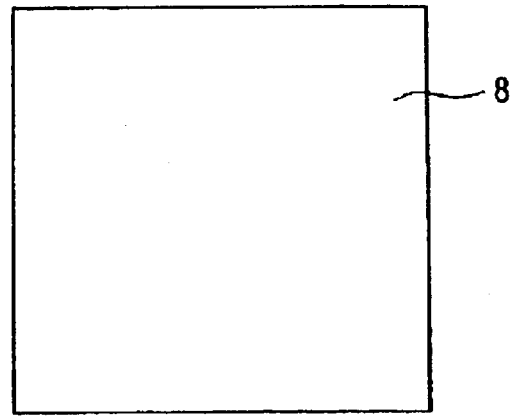

[FIG. 15]
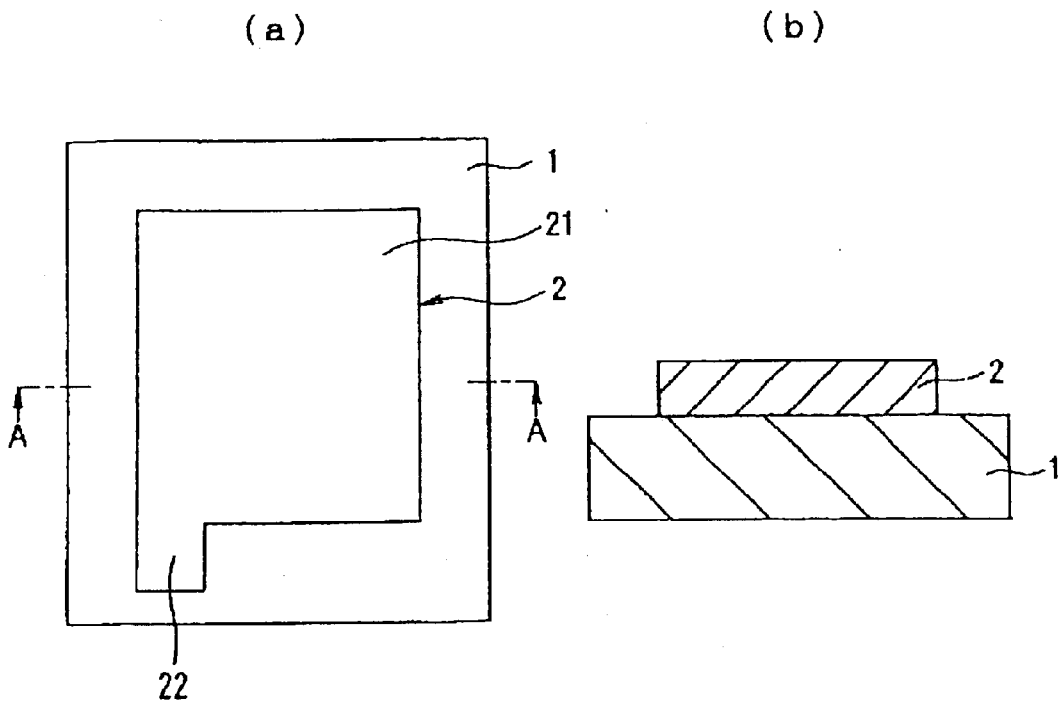
[FIG. 16]
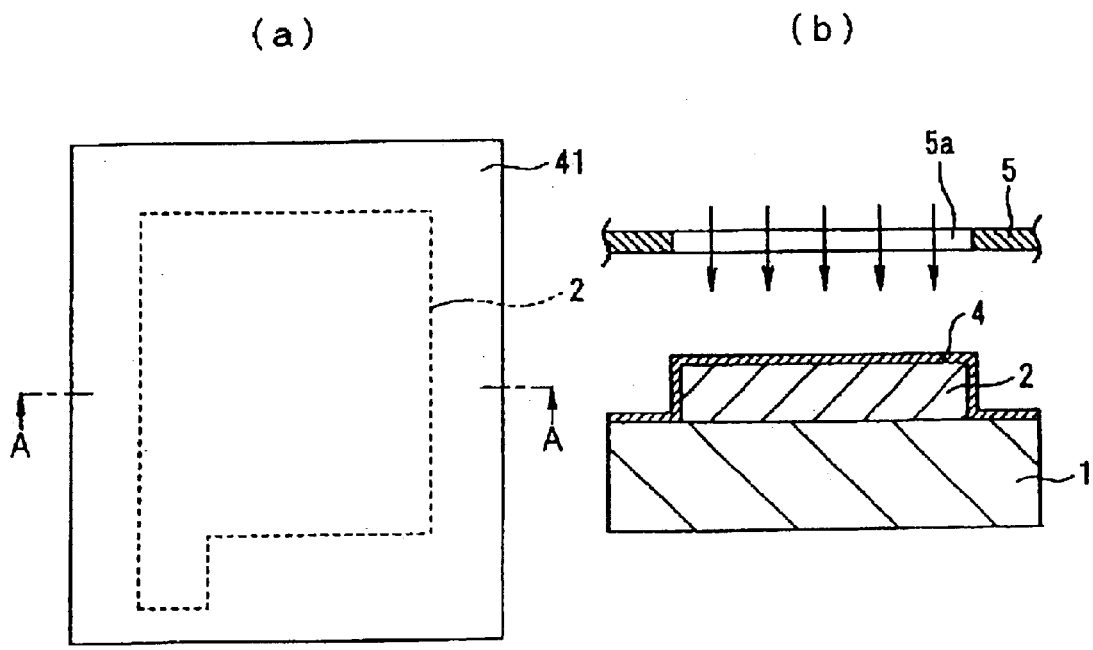

[FIG. 17]
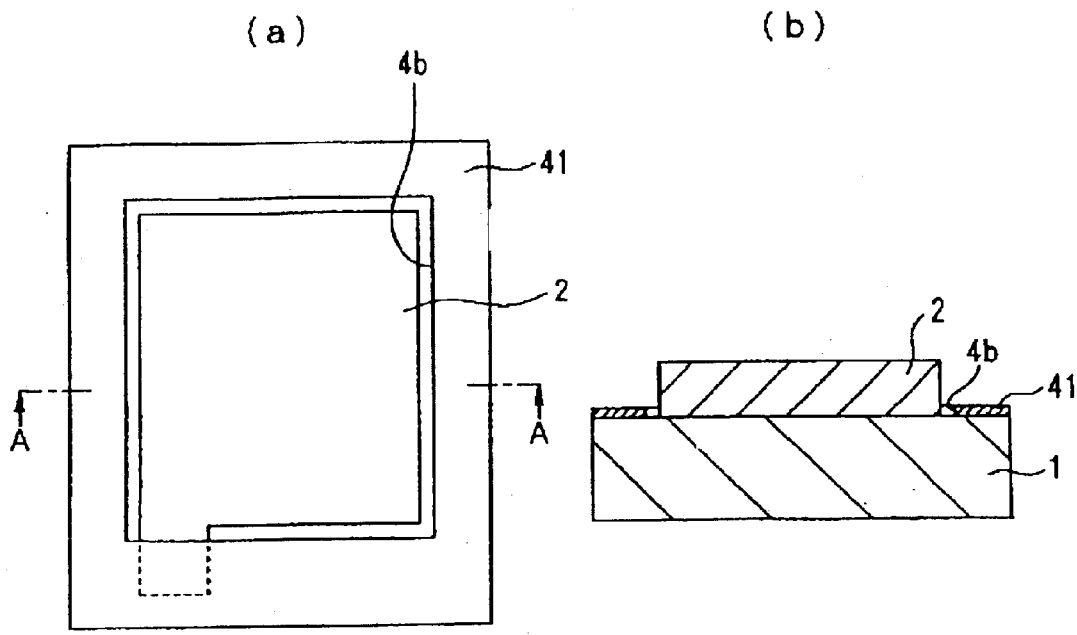
[FIG. 18]
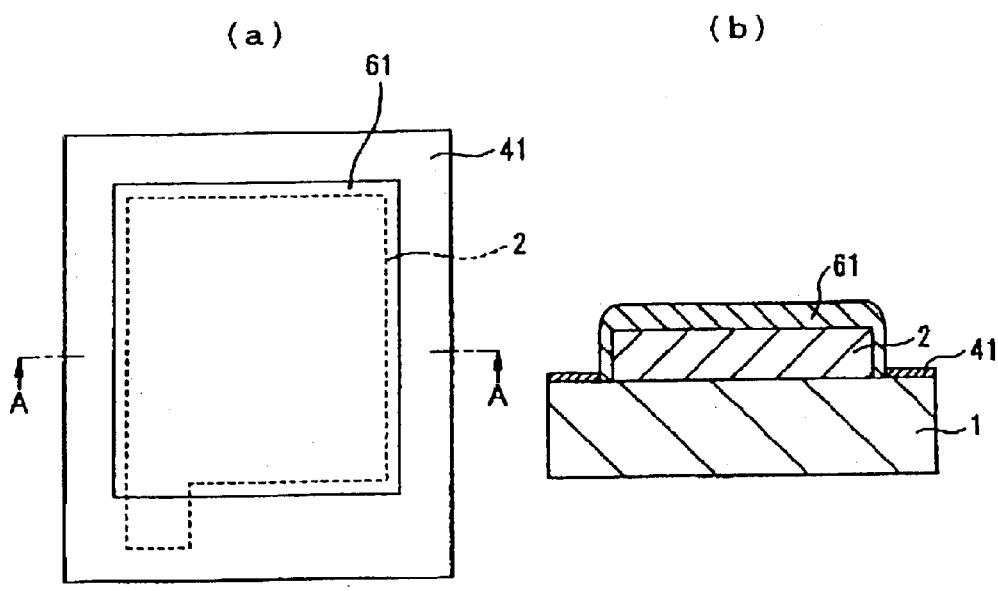

[FIG. 19]
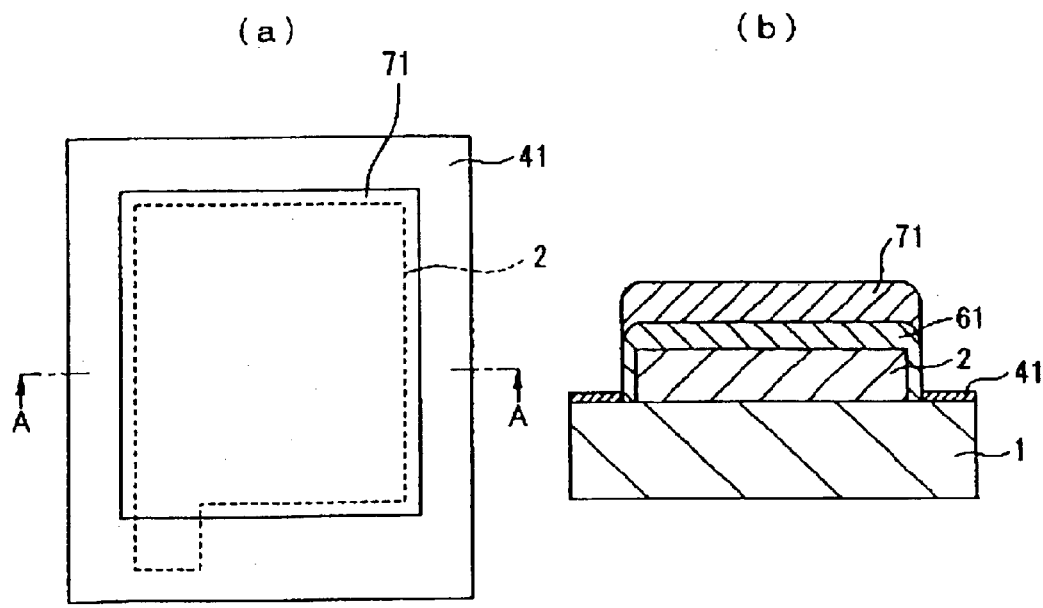
[FIG. 20]
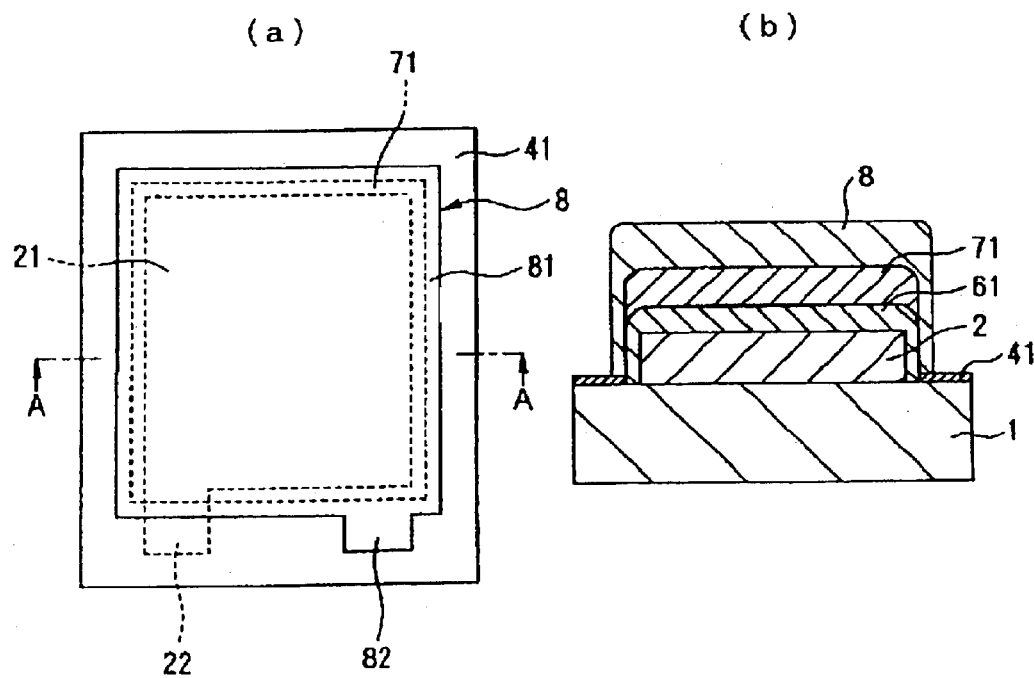

[FIG. 21]
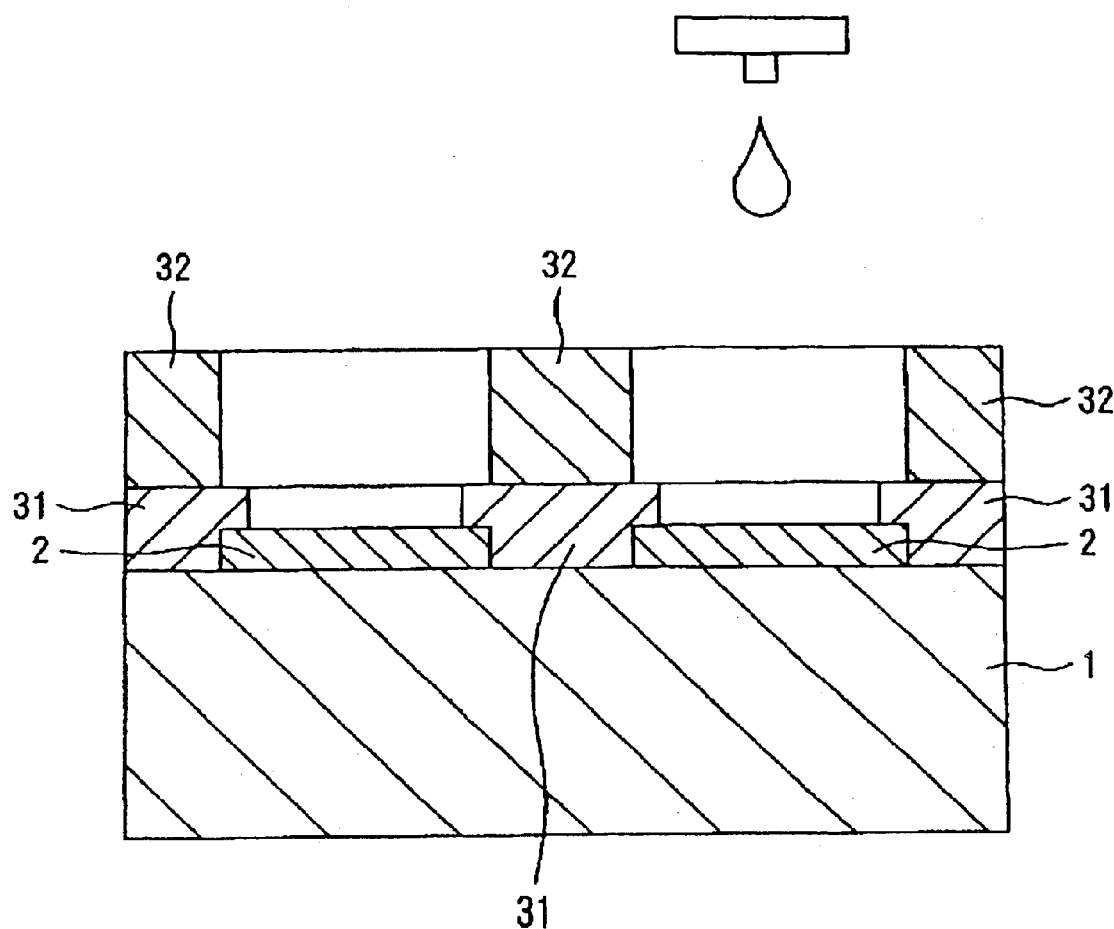
PRIOR ART

METHOD OF MANUFACTURING ORGANIC EL ELEMENT

This is a Divisional Application of U.S. patent application Ser. No. 09/820,759, filed Mar. 30, 2001, now U.S. Pat. No. 6,610,552.

BACKGROUND OF THE INVENTION

1. Field of Invention

The present invention relates to a method of manufacturing an organic EL (electroluminescent) element, and an organic EL element manufactured by the method.

2. Description of Related Art

In recent years, development of an organic EL element (a luminous element having a structure including an anode and a cathode, and a light emitting layer formed of an organic matter sandwiched between the anode and the cathode) has increasingly proceeded to provide a self-luminescent type display as an alternative to a liquid crystal display. Materials for the light emitting layer of such an organic EL element include, for example, a low molecular weight organic material, such as quinolinolatoaluminum complex (Alq3), and a high molecular weight organic material, such as poly(para-phenylene-vinylene) (PPV).

A film of a light emitting layer formed of a low molecular weight organic material is provided by a vapor deposition process, as is described in, for example, "Appl. Phys. Lett. 51(12), 21 Sep. 1987 pp. 913". A film of a light emitting layer formed of a high molecular weight organic material is provided by a coating process, as is described in, for example, "Appl. Phys. Lett. 71(1), 7 Jul. 1997 pp. 34+".

In many cases, a hole transporting layer is provided between the light emitting layer and the anode of the organic EL element. A hole is injected from the anode to the hole transporting layer, and the hole transporting layer transports the hole to the light emitting layer. When the light emitting layer has a capability of transporting a hole, the hole transporting layer is not always provided. In some cases, a hole injecting layer is provided as a layer other than the hole transporting layer. When the light emitting layer is formed of a high molecular weight material, such as PPV, a conductive polymer, such as a polythiophene derivative or a polyaniline derivative, is used as the hole transporting layer in many cases. When the light emitting layer is formed of a low molecular weight material, such as Alq3, a phenylamine derivative or the like is used as the hole transporting layer in many cases.

For example, in an organic EL element for display, anodes are formed in individual pixels on a substrate, and a light emitting layer and a hole transporting layer must be placed on each anode. Accordingly, if the light emitting layer and the hole transporting layer can be placed by ink jet process, coating (application) and patterning can be performed concurrently to thereby yield a patterning with a high precision for a short time. Additionally, this process is also effective to cut wastes in material and to reduce manufacturing cost, since a minimum of material is all that needs to be used.

To place the light emitting layer and hole transporting layer by ink jet process, liquid materials must be used. When a high molecular weight material such as PPV is used as the material for light emitting layer, the use of, for example, a solution of its precursor can place the light emitting layer by ink jet process. The placement of a light emitting layer that is formed of PPV high molecular weight material is described in, for example, Japanese Unexamined Patent Application Publication No. 11-40358, Japanese Unexamined Patent Application Publication No. 11-54270, and Japanese Unexamined Patent Application Publication No. 11-339957.

In the ink jet process, a region on which the light emitting layer and hole transporting layer are formed is surrounded with a barrier, and a liquid material is discharged toward the region surrounded with the barrier to thereby place the liquid material in the region. As the barrier, a two-layer structure barrier including a lower layer (substrate side) formed of an inorganic insulator, such as silicon oxide, and an upper layer formed of an organic polymer, such as polyimide is described in, for example, PCT International Publication No. WO99/48229.

FIG. 21 is a sectional view showing the aforementioned structure. Each of anodes 2 is formed in each pixel position on substrate 1, and lower barrier 31 formed of silicon oxide is formed so as to surround the periphery of each anode 2. Additionally, upper barrier 32 formed of polyimide is formed on lower barrier 31. Lower barrier 31 and upper barrier 32 are formed, for example, to a thickness (total thickness) of 1 to 3 $\mu$m by thin-film formation and patterning operations.

However, in the barrier of two-layer structure in which the upper barrier is formed of polyimide, the thickness of the light emitting layer might become uneven in the vicinity of the barrier and at the center, with regard to the height of the barrier, and of the affinity for polyimide of a liquid (a liquid containing a material for the formation of light emitting layer) discharged by ink jet process. When the thickness of the light emitting layer becomes uneven, the light emission color or the amount of light emission becomes uneven or unstable in the pixel to thereby deteriorate luminous efficacy.

In a color display in which red, green and blue three color pixels are placed adjacent to one another, it is necessary to ensure that different liquids are placed separately in adjacent pixels and to avoid the liquid in each pixel from being contaminated by another liquid for the adjacent pixel. The barrier having the aforementioned structure is also susceptible to being enhanced in this regard. In a contaminated pixel, purity of emitted light color is deteriorated.

In this connection, these problems can be enhanced also by the method described in PCT International Publication No. WO99/48229, but this method requires plasma treatment and is also susceptible to enhancement in, for example, cost.

The present invention has been accomplished focusing attention on these problems of the conventional technologies, and an object of the present invention is to ensure that a liquid is placed in a predetermined region (without placing the same in the adjacent region) to a uniform thickness in the region, when a light emitting layer or hole transporting layer constituting an organic EL element is placed by a liquid placing step such as ink jet process.

SUMMARY OF THE INVENTION

In order to solve the above problems, the present invention provides a method of manufacturing an organic EL element including a cathode, an anode, and one or more constitutive layers sandwiched between the cathode and anode, which constitutive layer includes at least a light emitting layer. The method includes the step of selectively placing a liquid containing a material for the formation of constitutive layer in a region for the formation of constitutive layer, using a pattern having an opening corresponding to the region for the formation of constitutive layer, in at least one constitutive layer, and, in the liquid placing step, an ultrathin organic film pattern having a surface being repellent to the liquid is formed as the pattern, using a compound having a functional group being bondable to the constitutive atom of a face, on which the film is formed, and a functional group being repellent to the liquid.

The liquid-repellency of the surface of the ultrathin organic film pattern preferably has such liquid-repellency that the contact angle of the liquid is 50° or more.

In the method according to the present invention, it is preferred that at least one constitutive layer is further subjected to the step of forming an ultrathin organic film on a face on which the constitutive layer is formed, which ultrathin organic film has a surface having affinity for the liquid, using a compound having a functional group being bondable to the constitutive atom of a face on which the film is formed, and a functional group having affinity for the liquid, and this step is between the ultrathin organic film pattern forming step and the liquid placing step.

The term "ultrathin film" as used in the present invention means a thin film having a thickness of about several nanometers (e.g., 3 nm or less). Such an ultrathin organic films includes, for example, a self-assembled film. The aforementioned ultrathin organic film pattern is preferably a pattern formed of a self-assembled film.

The term "self-assembled film" as used in the present invention means a monomolecular film which is obtained by allowing a compound having a straight-chain molecule and a functional group that can be combined with the constitutive atom of a face on which the film is formed and is bonded to the straight-chain molecule to become in the state of a gas or liquid and coexistent with the face on which the film is formed. In the monomolecular film, the functional group is adsorbed by the film-forming face and is bonded with the constitutive atom of the film-forming face, and the straight-chain molecule is formed facing the outside. This monomolecular film is referred to as a self-assembled film, since it is formed by spontaneous chemical adsorption of the compound to the film-forming face.

In this connection, the self-assembled film is described in detail by A. Ulman in Chapter 3 of "An Introduction to Ultrathin Organic Film From Langmuir-Blodgett to Self-assembly" (Academic Press Inc., Boston, 1991).

The liquid-repellent ultrathin organic film pattern includes a pattern formed of a self-assembled film which is formed by using a material having a fluoroalkyl group, such as a fluoroalkylsilane. In this case, the face on which the film is formed must be converted into hydrophilic.

When a self-assembled film is formed on a hydrophilic film-forming face (a film-forming face on which a hydrophilic group such as hydroxyl group exists) using a fluoroalkylsilane, a siloxane bond is formed by dehydration reaction with the hydroxyl group of the film-forming face, and a fluoroalkyl group (CF3(CF2)n(CH2)n-) is placed at the end of a straight-chain molecule, and the surface of the resulting self-assembled film becomes repellent to liquid (a property resistant to wetting with a liquid).

The ultrathin organic film forming step can be performed by the step of entirely forming an ultrathin organic film having a liquid-repellent surface using the compound, and the step of irradiating the ultrathin organic film with ultraviolet radiation via a photomask to thereby remove a portion corresponding to the constitutive layer forming region of the ultrathin organic film.

The lyophilic ultrathin organic film is preferably a self-assembled film formed of a material having an amino group or carboxyl group as a lyophilic functional group. When an amino group or carboxyl group is present on the surface, the film has a high affinity for, for example, water and alcohol which are generally used as a solvent in a material for the formation of hole transporting layer.

As the material for the formation of hole transporting layer, for example, a mixture of polyethylene dioxythiophene with poly(styrenesulfonic acid), or copper phthalocyanine is used. Accordingly, a self-assembled film formed by the use of an alkylsilane having an amino group or carboxyl group as a lyophilic functional group is preferably used as the lyophilic ultrathin organic film which is formed as an underlayer of the hole transporting layer. By this configuration, the adhesion of the material for the formation of hole transporting layer is enhanced, since the resulting self-assembled film has an amino group or carboxyl group on its surface.

As the material for the formation of light emitting layer, for example, polyfluorene-based polymer or poly (phenylene-vinylene)-based polymer is used. Accordingly, when the lyophilic ultrathin organic film is formed as an underlayer of the light emitting layer, a self-assembled film, which is formed by the use of an alkylsilane having, for example, an allyl group, vinyl group, phenyl group, or benzyl group as the lyophilic functional group, is preferably used as the lyophilic ultrathin organic film. By this configuration, the adhesion of the light emitting layer formed of a polyfluorene-based polymer or poly(phenylene-vinylene)-based polymer is enhanced, since the resulting self-assembled film has an allyl group, vinyl group, phenyl group, or benzyl group on its surface.

The present invention provides a method in which the liquid placing step in the invented method is performed by ink jet process. Specifically, when the organic EL element is manufactured as an element constituting a pixel of a color display in which red, green and blue three color pixels are placed adjacent to one another, the invented method is preferably employed when a liquid containing a material for the formation of light emitting layer and/or hole transporting layer is placed by ink jet process.

he present invention provides, in another aspect, an organic EL element which includes a cathode and an anode, and a light emitting layer, a hole injecting layer and/or a hole transporting layer sandwiched between the cathode and the anode, at least one of the light emitting layer and the hole injecting layer and/or the hole transporting layer is surrounded with a barrier, which barrier has a two-layer structure composed of a thin insulating film layer and an ultrathin organic film layer formed on the thin insulating film layer. The ultrathin organic film layer has a liquid-repellent surface and is formed by using a compound having a functional group being bondable to the constitutive atom of a face on which the film is formed, and a functional group being repellent to the liquid.

The thin insulating film constituting the barrier of this two-layer thin film preferably has a film thickness of 50 to 200 nm, and the ultrathin organic film layer preferably has a film thickness of 3 nm or less.

BRIEF DESCRIPTION OF THE DRAWINGS

FIG. 1A is a sectional view of a pixel showing a first step of a method according to the first embodiment of the present invention.

FIG. 1B is a plan view of the pixel showing the first step of the method according to the first embodiment of the present invention.

FIG. 2A is a sectional view of the pixel showing a second step of the method according to the first embodiment of the present invention.

FIG. 2B is a plan view of the pixel showing the second step of the method according to the first embodiment of the present invention.

FIG. 3A is a sectional view of the pixel showing a third step of the method according to the first embodiment of the present invention.

FIG. 3B is a plan view of the pixel showing the third step of the method according to the first embodiment of the present invention.

FIG. 4A is a sectional view of the pixel showing a fourth step of the method according to the first embodiment of the present invention.

FIG. 4B is a plan view of the pixel showing the fourth step of the method according to the first embodiment of the present invention.

FIG. 5A is a sectional view of the pixel showing a fifth step of the method according to the first embodiment of the present invention.

FIG. 5B is a plan view of the pixel showing the fifth step of the method according to the first embodiment of the present invention.

FIG. 6A is a sectional view of the pixel showing a sixth step of the method according to the first embodiment of the present invention.

FIG. 6B is a plan view of the pixel showing the sixth step of the method according to the first embodiment of the present invention.

FIG. 7A is a sectional view of the pixel showing a seventh step of the method according to the first embodiment of the present invention.

FIG. 7B is a plan view of the pixel showing the seventh step of the method according to the first embodiment of the present invention.

FIG. 8A is a sectional view of the pixel showing an eighth step of the method according to the first embodiment of the present invention.

FIG. 8B is a plan view of the pixel showing the eighth step of the method according to the first embodiment of the present invention.

FIG. 9A is a sectional view of a pixel showing a first step of a method according to the second embodiment of the present invention.

FIG. 9B is a plan view of the pixel showing the first step of the method according to the second embodiment of the present invention.

FIG. 10A is a sectional view of the pixel showing a second step of the method according to the second embodiment of the present invention.

FIG. 10B is a plan view of the pixel showing the second step of the method according to the second embodiment of the present invention.

FIG. 11A is a sectional view of the pixel showing a third step of the method according to the second embodiment of the present invention.

FIG. 11B is a plan view of the pixel showing the third step of the method according to the second embodiment of the present invention.

FIG. 12A is a sectional view of the pixel showing a fourth step of the method according to the second embodiment of the present invention.

FIG. 12B is a plan view of the pixel showing the fourth step of the method according to the second embodiment of the present invention.

FIG. 13A is a sectional view of the pixel showing a fifth step of the method according to the second embodiment of the present invention.

FIG. 13B is a plan view of the pixel showing the fifth step of the method according to the second embodiment of the present invention.

FIG. 14A is a sectional view of the pixel showing a sixth step of the method according to the second embodiment of the present invention.

FIG. 14B is a plan view of the pixel showing the sixth step of the method according to the second embodiment of the present invention.

FIG. 15A is a sectional view of a pixel showing a first step of a method according to the third embodiment of the present invention.

FIG. 15B is a plan view of the pixel showing the first step of the method according to the third embodiment of the present invention.

FIG. 16A is a sectional view of the pixel showing a second step of the method according to the third embodiment of the present invention.

FIG. 16B is a plan view of the pixel showing the second step of the method according to the third embodiment of the present invention.

FIG. 17A is a sectional view of the pixel showing a third step of the method according to the third embodiment of the present invention.

FIG. 17B is a plan view of the pixel showing the third step of the method according to the third embodiment of the present invention.

FIG. 18A is a sectional view of the pixel showing a fourth step of the method according to the third embodiment of the present invention.

FIG. 18B is a plan view of the pixel showing a fourth step of the method according to the third embodiment of the present invention.

FIG. 19A is a sectional view of the pixel showing a fifth step of the method according to the third embodiment of the present invention.

FIG. 19B is a plan view of the pixel showing the fifth step of the method according to the third embodiment of the present invention.

FIG. 20A is a sectional view of the pixel showing a sixth step of the method according to the third embodiment of the present invention.

FIG. 20B is a plan view of the pixel showing the sixth step of the method according to the third embodiment of the present invention.

FIG. 21 is a diagram showing a conventional step of placing a liquid.

DETAILED DESCRIPTION OF PREFERRED EMBODIMENTS

The embodiments of the present invention will be illustrated below.

[First Embodiment]

The first embodiment of the present invention will be illustrated with reference to FIGS. 1 to 8. One embodiment of the present invention will be described herein, taking a display including, as pixels, organic EL elements as example. In each figure, A is a sectional view of one pixel, and B is a plan view thereof. This organic EL element includes two constitutive layers, i.e., a hole transporting layer and a light emitting layer, between an anode and a cathode.

Initially, ITO electrode (anode) 2 is formed in each pixel position on glass substrate 1, as shown in FIG. 1. On glass substrate 1, a semiconductor device that drives organic EL element, for example, has been formed in advance.

Next, a thin $SiO_2$ film is formed on all of glass substrate 1 by, for example, CVD process. Subsequently, a conventional patterning step including a photolithography step and an etching step is preformed to thereby form opening 3a in a region on which constitutive layer is formed (a predetermined region on ITO electrode 2) of the thin $SiO_2$ film. By this procedure, thin $SiO_2$ film pattern 3 is formed on the outermost surface of glass substrate 1. FIG. 2 shows this state. In the present embodiment, opening 3a is circular and the thin $SiO_2$ film has a thickness of 150 nm.

Next, self-assembled film 4 is formed on all of the faces (the top face of thin $SiO_2$ film pattern 3, the top face of ITO electrode 2 exposed to opening 3a, and the inner wall of opening 3a) of glass substrate 1 using heptadecafluorotetrahydrodecyltrimethoxysilane. Fluid-repellent fluoroalkyl groups are present on all of the surface of self-assembled film 4. Here, self-assembled film 4 having a thickness of about 1 nm is formed by allowing glass substrate 1 in the state shown in FIG. 2 to stand in the atmosphere of heptadecafluorotetrahydrodecyltrimethoxysilane for 96 hours. FIG. 3 shows this state.

In this state, concave 4a defined by self-assembled film 4 is disposed on glass substrate 1. The shape of opening of concave 4a is the same, circular, as in opening 3a of thin $SiO_2$ film pattern 3, and the radius thereof is smaller than that of opening 3a by a factor of the thickness of self-assembled film 4.

Next, self-assembled film 4 on glass substrate 1 is irradiated with ultraviolet radiation (wavelength: 172 nm) via photomask 5 having light transmitting part 5a corresponding to the circular opening of concave 4a, as shown in FIG. 4. By this procedure, self-assembled film 4 in portions exposed to ultraviolet radiation, i.e., the top face of ITO electrode 2 and the inner wall of opening 3a is removed, and self-assembled film 4 remains only on the top face of thin $SiO_2$ film pattern 3.

Thus, ultrathin organic film pattern 41 having a liquid-repellent surface is formed on thin $SiO_2$ film pattern 3. Opening 4b of ultrathin organic film pattern 41 is placed so that its inner wall is located at the same location or somewhat outside of the inner wall of opening 3a of thin $SiO_2$ film pattern 3.

In this state, as shown in FIG. 5, liquid 6 containing a material for the formation of a hole transporting layer is discharged toward opening 4b of ultrathin organic film pattern 41 from above by ink jet process. In this embodiment, an aqueous solution of polyethylene dioxythiophene and poly(styrenesulfonic acid) as materials for the formation of hole transporting layer is used as liquid 6.

The surface of ultrathin organic film pattern 41 becomes repellent to liquid, and discharged liquid 6 does not remain on the top face of ultrathin organic film pattern 41 and all of discharged liquid 6 enters opening 3a. When liquid 6 overflows opening 3a, the top face of liquid 6 is raised over opening 4b of ultrathin organic film pattern 41, as shown by a chain double-dashed line in FIG. 5. Accordingly, liquid 6 discharged toward one opening 4b does not enter an adjacent opening 4b.

Next, glass substrate 1 is heated at a predetermined temperature to thereby remove the solvent from discharged liquid 6. By this procedure, hole transporting layer 61 formed of a mixture of polyethylene dioxythiophene and poly(styrenesulfonic acid) is formed in opening 3a of thin $SiO2$ film pattern 3. FIG. 6 shows this state. In this embodiment, hole transporting layer 61 has a thickness of 60 nm.

Next, in this state, liquid 7 containing a material for the formation of light emitting layer is discharged toward opening 4b of ultrathin organic film pattern 41 from above by ink jet process, as shown in FIG. 6. A liquid, a solution of poly(para-phenylene-vinylene) (a material for the formation of light emitting layer) in xylene, is used as liquid 7 containing a material for the formation of light emitting layer.

As is described above, the surface of ultrathin organic film pattern 41 becomes repellent to liquid also in this case, and discharged liquid 7 does not remain on the top face of ultrathin organic film pattern 41 and instead all of which enters opening 3a. Accordingly, liquid 7 discharged toward one opening 4b does not enter an adjacent opening 4b.

Next, glass substrate 1 is heated at a predetermined temperature to thereby remove the solvent from discharged liquid 7. By this procedure, light emitting layer 71 formed of, for example, a polyfluorene-based polymer is provided in opening 3a of thin $SiO2$ film pattern 3. FIG. 7 shows this state. In this embodiment, light transmitting layer 71 has a thickness of 80 nm.

Next, in this state, cathode 8 is formed in a position over ITO electrode 2 of glass substrate 1. Cathode 8 is formed from a material that has an appropriate work function and is selected depending on the light emitting layer. In this embodiment, cathode 8 is formed as a two-layer structure cathode layer by forming a thin calcium film having a thickness of 10 nm by vapor deposition process, and further forming a thin aluminium film having a thickness of 400 nm on the thin calcium film by vapor deposition process. A protective film is formed or a sealing glass is bonded on cathode 8 according to necessity.

Thus, an organic EL element having hole transporting layer 61 and light emitting layer 71 between ITO electrode (anode) 2 and cathode 8 is formed in each pixel position of the display. In this organic EL element, light emitting layer 71 and hole transporting layer 61 are surrounded with a two-layer structure barrier formed of thin $SiO_2$ film pattern (thin insulating film layer) 3 and ultrathin organic film pattern (ultrathin organic film layer having a liquid-repellent surface) 41. Thin $SiO_2$ film pattern 3 is formed herein so as to prevent electric leak between ITO electrode (anode) 2 and cathode 8.

According to the method of the present embodiment, liquids 6 and 7 containing materials for the formation of hole transporting layer 61 and light emitting layer 71 are discharged, by ink jet process, toward opening 4b of ultrathin organic film pattern 41 from above ultrathin organic film pattern 41 having a liquid-repellent surface. Therefore, liquids 6 and 7 discharged toward one opening 4b are prevented from entering an adjacent opening 4b. Accordingly, by producing organic EL elements of a color display in which red, green and blue three color pixels are placed adjacent to one another according to the method of the present embodiment, purity of light color emitted from a pixel of each color can be increased.

Separately, in a conventional liquid-repellent pattern formed of plasma-treated polyimide, discharged liquids may exist as convex or concave droplets in the opening of the liquid-repellent pattern, since the film thickness is on the order of micrometers and the surface condition cannot be significantly controlled in plasma treatment. The convex or concave droplets have difference in height on the order of micrometers corresponding to the film thickness of the liquid-repellent pattern. Specifically, the droplets may have uneven height in one opening 3a. Additionally, the droplets may have different shapes in different plural openings in some cases.

Contrary to this, ultrathin organic film pattern 41 according to the present embodiment is very thin of about 1 nm, and has an excellent repellency to liquid, and the discharged liquid does never exist as a convex or concave droplet in opening 4b of ultrathin organic film pattern 41, and instead is in the state that its top face is raised over opening 4b. As a result, the intra-opening 3a uniformity and inter-opening uniformity of the film thickness of hole transporting layer 61 and light emitting layer 71 can be increased, as compared with the conventional liquid-repellent pattern.

[Second Embodiment]

The second embodiment of the present invention will be described with reference to FIGS. 9 to 14. One embodiment of the present invention is described herein, taking a display having organic EL elements as pixels as an example. In each figure, A is a sectional view of one pixel, and B is a plan view thereof This organic EL element includes two constitutive layers, i.e., a hole transporting layer and a light emitting layer, between an anode and a cathode.

Initially, ITO electrode (anode) 2 is formed in each pixel position on glass substrate 1, thin SiO2 film pattern 3 having opening 3a is formed thereon, and ultrathin organic film pattern 41 having a liquid-repellent surface is formed on thin SiO2 film pattern 3, by performing the steps shown in FIGS. 1 to 4 in the same manner as in the first embodiment. FIG. 9 shows this state.

Next, self-assembled film 9 is formed on the top face of ITO electrode 2 exposed to opening 3a on glass substrate 1, using aminopropyltriethoxysilane. FIG. 10 shows this state. Lyophilic amino groups are present on all of the surface of self-assembled film 9. In this embodiment, self-assembled film 9 having a thickness of about 0.5 nm is formed by dipping glass substrate 1 in the state shown in FIG. 9 in a methanol 1% solution containing aminopropyltriethoxysilane, and rinsing the glass substrate with methanol and with water.

Next, in this state, the same liquid 6 (a liquid containing a material for the formation of hole transporting layer) as in the first embodiment is discharged toward opening 4b of ultrathin organic film pattern 41 from above by ink jet process. The surface of ultrathin organic film pattern 41 becomes repellent to liquid, and discharged liquid 6 does not remain on the top face of ultrathin organic film pattern 41 and instead all of discharged liquid 6 enters opening 3a. Accordingly, liquid 6 discharged toward one opening 4b does never enter an adjacent opening 4b.

Additionally, self-assembled film (ultrathin organic film) 9 having amino groups on its surface is formed on the top face of ITO electrode 2, and discharged liquid 6 is placed dense in the state that it uniformly spreads over self-assembled film 9.

Next, glass substrate 1 is heated at a predetermined temperature to thereby remove the solvent from discharged liquid 6. By this procedure, hole transporting layer 61 formed of a mixture of polyethylene dioxythiophene and poly(styrenesulfonic acid) is formed in opening 3a of thin SiO2 film pattern 3. FIG. 11 shows this state. Hole transporting layer 61 has a thickness of 60 nm also in this embodiment.

Next, glass substrate 1 in this state is dipped in a methanol 1% solution containing allyltriethoxysilane, and is then rinsed with methanol and with water to thereby form self-assembled film 10 having a thickness of about 0.4 nm on the top surface of hole transporting layer 61 exposed to opening 3a. Allyl groups are present on all of the surface of self-assembled film 10. FIG. 12 shows this state.

Next, the same liquid 7 (a liquid containing a material for the formation of light emitting layer) as in the first embodiment is discharged toward opening 4b of ultrathin organic film pattern 41 from above by ink jet process, as shown in FIG. 12. As described above, the surface of ultrathin organic film pattern 41 becomes repellent to liquid also in this case, and discharged liquid 7 does not remain on the top face of ultrathin organic film pattern 41, and instead all of which enters opening 3a. Accordingly, liquid 7 discharged toward one opening 4b does not enter an adjacent opening 4b.

Additionally, self-assembled film (an ultrathin organic film having a lyophilic surface) 10 having allyl groups lyophilic to liquid 7 on its surface (a solution of poly(para-phenylene-vinylene) in xylene) is formed on the top face of hole transporting layer 61, and discharged liquid 7 is placed in the state that it uniformly spreads over self-assembled film 10.

Next, glass substrate 1 is heated at a predetermined temperature to thereby remove the solvent from discharged liquid 7. By this procedure, light emitting layer 71 formed of poly(para-phenylene-vinylene) is formed in opening 3a of thin SiO2 film pattern 3. FIG. 13 shows this state.

Next, in this state, cathode 8 is formed in a position over ITO electrode 2 of glass substrate 1. FIG. 14 shows this state. A two-layer structure cathode layer formed of a thin calcium film having a thickness of 10 nm and a thin aluminium film having a thickness of 400 nm is also formed in this embodiment as in the first embodiment. A protective film is formed or a sealing glass is bonded on cathode 8 according to necessity Thus, an organic EL element having hole transporting layer 61 and light emitting layer 71 between ITO electrode (anode)2 and cathode 8 is formed in each pixel position of the display. This organic EL element includes self-assembled films 9 and 10 between ITO electrode 2 and hole transporting layer 61 and between hole transporting layer 61 and light emitting layer 71. These self-assembled films 9 and 10 are thin in film thickness and have an opening in which the hole can easily move and they do not significantly deteriorate the performances of the organic EL element.

Additionally, in this organic EL element, light emitting layer 71 and hole transporting layer 61 are surrounded with a two-layer structure barrier formed of thin SiO2 film pattern (thin insulating film layer) 3 and ultrathin organic film pattern (ultrathin organic film layer having a liquid-repellent surface) 41.

According to the method of the present embodiment, the effect of increasing the durability of the organic EL element can be obtained, in addition to the effects as in the first embodiment, since the presence of self-assembled films 9 and 10 increases adhesion between ITO electrode 2 and hole transporting layer 61 and adhesion between hole transporting layer 61 and light emitting layer 71. Additionally, the uniformity in film thickness of hole transporting layer 61 and of light emitting layer 71 in opening 3a of thin $SiO_2$ film pattern 3 can be further increased in comparison with the organic EL element obtained in the first embodiment.

[Third Embodiment]

The third embodiment of the present invention will be described below with reference to FIGS. 15 to 20. One embodiment in which an organic EL element is applied to a surface light source device such as back light will be illustrated herein. In each figure, A is a plan view, and B is a sectional view of A along with the lines A—A. This organic EL element includes two layers, i.e., a hole transporting layer and a light emitting layer, as constitutive layers between a cathode and an anode.

Initially, ITO electrode (anode) 2 in a predetermined shape is formed on glass substrate 1, as shown in FIG. 15. ITO electrode 2 is formed of rectangular sandwiching part 21 that sandwiches the constitutive layers and terminal part 22 protruding from sandwiching part 21. ITO electrode 2 is formed by performing a conventional patterning step including a photolithography step and an etching step, after the formation of the thin ITO film by, for example, sputtering process. In this embodiment, ITO electrode 2 has a thickness of 150 nm.

Next, self-assembled film 4 is formed on all of the faces of glass substrate 1 using heptadecafluorotetrahydrodecyltriethoxysilane, as shown in FIG. 16. Fluid-repellent fluoroalkyl groups are present on all of the surface of self-assembled film 4. Glass substrate 1 in the state shown in FIG. 15 is allowed to stand in the atmosphere of heptadecafluorotetrahydrodecyltriethoxysilane for 96 hours to thereby form self-assembled film 4 having a film thickness of about 1 nm.

Next, self-assembled film 4 on glass substrate 1 is irradiated with ultraviolet radiation (wavelength: 172 nm) via photomask 5 having a light transmitting part corresponding to the region for the formation of constitutive layer (a rectangular region which is of a size larger than that of sandwiching part 21 of ITO electrode 2). By this procedure, the self-assembled film in portions exposed to ultraviolet radiation is removed to thereby form ultrathin organic film pattern 41 that defines opening 4b corresponding to the region for the formation of constitutive layer and has a liquid-repellent surface, as shown in FIG. 17.

In this state, an aqueous solution of a mixture (a material for the formation of hole transporting layer) of polyethylene dioxythiophene and poly(styrenesulfonic acid) is applied on the top face of glass substrate 1 by spin coating process. In this procedure, the surface of ultrathin organic film pattern 41 becomes repellent to liquid, and the liquid does not remain on the top face of ultrathin organic film pattern 41 and instead enters opening 4b alone and adheres onto ITO electrode 2 in opening 4b.

Next, glass substrate 1 is heated at a predetermined temperature to dry the film of the applied liquid to thereby form hole transporting layer 61 on ITO electrode 2. FIG. 18 shows this state. In this embodiment, hole transporting layer 61 has a thickness of 60 nm.

Next, a liquid, a solution of poly(para-phenylene-vinylene) (a material for the formation of light emitting layer) in xylene, is applied onto the top face of glass substrate 1 by spin coating process. Also in this procedure, the liquid is rejected by ultrathin organic film pattern 41 having a liquid-repellent surface, and enters opening 4b alone and adheres onto hole transporting layer 61 in opening 4b. Next, glass substrate 1 is heated at a predetermined temperature to dry the film of the applied liquid to thereby form light emitting layer 71 on hole transporting layer 61. FIG. 19 shows this state. In this embodiment, light transmitting layer 71 has a thickness of 80 nm.

Next, cathode 8 is formed on light emitting layer 71. Cathode 8 in this embodiment is also formed of rectangular sandwiching part 81 that sandwiches the constitutive layers, and terminal part 82 protruding from sandwiching part 81, which terminal part 82 is placed in a position in the same side of that of terminal part 22 of anode 2 but not overlapping the same. A two-layer structure anode layer formed of a thin calcium film having a thickness of 10 nm and a thin aluminium film having a thickness of 400 nm is also formed in this embodiment in the same manner as in the first embodiment.

Next, ultrathin organic film pattern 41 is removed to allow terminal part 22 of anode 2 to expose itself, and then a protective film is formed or a sealing glass is bonded on cathode 8 according to necessity.

Thus, an organic EL element having hole transporting layer 61 and light emitting layer 71 between ITO electrode (anode) 2 and cathode 8 is formed as a surface light source device.

According to the method of the present embodiment, when each liquid containing a material for the formation of hole transporting layer 61 or light emitting layer 71 is applied by spin coating process, the portions other than the regions for the formation of the two layers 61 and 71 are covered with ultrathin organic film pattern 41 having a liquid-repellent surface, and each liquid is prevented from adhering to, for example, the reverse face of glass substrate 1.

In this connection, in the method of manufacturing an organic EL element for surface light source device, a process (dipping process) in which the top face of glass substrate 1 is dipped in the liquid can also be advantageously employed as the process for applying each liquid containing a material for the formation of hole transporting layer 61 or light emitting layer 71, in addition to the spin coating process.

Separately, in the method of manufacturing an organic EL element for display pixel, spin coating process or dipping process can also be employed as the process for applying the liquid containing a material for the formation of hole transporting layer 61. In the method of manufacturing an organic EL element for display pixel, spin coating process or dipping process can also be employed as the process for applying the liquid containing a material for the formation of light emitting layer 71, except when the display is a color display in which red, green and blue three color pixels are placed adjacent to one another.

Additionally, the lyophilic ultrathin organic film (self-assembled films 9 and 10) may be formed by a process in which glass substrate 1 is dipped in a solution of an alkylsilane having an amino group or carboxyl group in a solvent such as methanol or ethanol.

In the first embodiment and second embodiment, thin insulating film layer 3 can also be formed by the following method. Initially, glass substrate 1 in the state shown in FIG. 1 is allowed to stand in the atmosphere of heptadecafluorotetrahydrodecyltriethoxysilane for 96 hours to thereby form a self-assembled film having a liquid-repellent surface. Next, this self-assembled film is irradiated with ultraviolet radiation (wavelength: 172 nm) via a photomask having a light shielding part corresponding to the region for the formation of constitutive layers, and a light transmitting part corresponding to the other portions. By this procedure, the self-assembled film only remains on the region for the formation of constitutive layer on ITO electrode 2.

Next, a solution of peroxypolysilazane in a solvent is applied onto the surface of the glass substrate in this state. By this procedure, this solution does not remain on the self-assembled film having a liquid-repellent surface and is placed in the opening (a portion other than the region for the formation of constitutive layers on ITO electrode 2) of the self-assembled film. Next, the glass substrate in this state is heated at a predetermined temperature to thereby form a thin insulating film mainly containing silicon oxide in the aforementioned portion.

Next, the surface of the glass substrate in this state is irradiated with ultraviolet radiation (wavelength: 172 nm) to thereby remove the self-assembled film remaining on the region for the formation of constitutive layers on ITO electrode 2. As a result, thin insulating film layer 3 having opening 3a in the region for the formation of constitutive layers is formed on ITO electrode 2, as shown in FIG. 2.

As described above, the invented method of manufacturing an organic EL element can ensure that a liquid containing a material for the formation of constitutive layer (light emitting layer or hole transporting layer) (without being placed in the adjacent region) is placed in the region for the formation of constitutive layers with a uniform thickness in the region. Additionally, the invented method can suppress cost, in comparison with a method using plasma treatment.

In particular, by applying the invented method to a method of producing an organic EL element for a color display pixel, in which a liquid containing a material for the formation of light emitting layer is placed by ink jet process, and red, green and blue three color pixels are placed adjacent to one another, the purity of light color emitted from a pixel of each color can be increased and luminous efficacy can be increased.

What is claimed is:

1. An organic EL element, comprising:
   a cathode;
   an anode;
   a light emitting layer;
   at least one of a hole injecting layer and a hole transporting layer sandwiched between said cathode and said anode; and
   a barrier surrounding at least one of said light emitting layer, said hole injecting layer and said hole transporting layer, said barrier including a first film and a second film formed on said first film, said second film having repellency to a liquid, said second film being formed by using a compound having a functional group being bondable to a constitutive atom of a face of said first film on which said second film is forced, and said compound being repellent to said liquid.

2. The organic EL element according to claim 1, said compound having a fluoroalkyl group.

3. The organic EL element according to claim 1, said functional group being alkoxysilyl group.

4. The organic EL element according to claim 1, said compound having at least one of an amino group and carboxy group.

5. The organic EL element according to claim 1, said compound being an organic compound.

6. The organic EL element according to claim 1, irradiation of said component with a light inducing a change of lyophilicity of said compound.

7. The EL element according to claim 1, said first film and said second film being insulating films.

8. An organic EL element comprising:
   a cathode;
   an anode;
   a light emitting layer;
   at least one of a hole injecting layer and a hole transporting layer sandwiched between said cathode and said anode; and
   a barrier surrounding at least one of said light emitting layer, said hole injecting layer and said hole transporting layer, at least one of said light emitting layer, said hole injecting layer and said hole transporting layer being formed by using a liquid containing a respective material for the at least one of said light emitting layer, said hole injecting layer and said hole transporting layer, said barrier including a first film and a second film formed on said first film, said second film being formed by using a compound having a functional group being bondable to a constitutive atom of a face of said first film on which said second film is formed, and said compound being repellent to said liquid containing said respective material.

9. The organic EL element according to claim 8, said second film having repellency to said liquid containing said respective material.

10. An organic EL element, comprising:
    a cathode;
    an anode;
    a light emitting layer;
    at least one of a hole injecting layer and a hole transporting layer sandwiched between said cathode and said anode; and
    a barrier surrounding at least one of said light emitting layer, said hole injecting layer and said hole transporting layer, said barrier having a two-layer structure formed of a thin insulating film layer and an ultrathin organic film layer formed on said thin insulating film layer, said ultrathin organic film layer having a liquid-repellent surface and being formed by using a compound having a functional group being bondable to the constitutive atom of a face on which the film is formed, and a functional group being repellent to said liquid.

* * * * *